United States Patent [19]

Zhu

[11] Patent Number: 5,506,715
[45] Date of Patent: Apr. 9, 1996

[54] LIGHTING SYSTEM HAVING A REMOTELY CONTROLLED ELECTRIC LAMP AND AN INFRARED REMOTE CONTROLLER WITH IMPROVED INFRARED FILTER

[75] Inventor: Joshua S. Zhu, Torrance, Calif.

[73] Assignee: Philips Electronics North America Corporation, New York, N.Y.

[21] Appl. No.: 419,742

[22] Filed: Apr. 12, 1995

Related U.S. Application Data

[63] Continuation of Ser. No. 146,294, Oct. 28, 1993, abandoned.

[51] Int. Cl.$^6$ .................................................. H04B 10/00
[52] U.S. Cl. ........................ 359/147; 359/111; 359/142; 359/189; 315/149; 250/214 B; 364/724.01; 362/233; 340/825.72
[58] Field of Search .................................... 359/142, 144, 359/147, 157, 168, 189, 193, 111; 340/825–872; 348/342; 485/307; 362/233, 293; 315/149, 151; 250/214 B; 364/724.01

[56] References Cited

U.S. PATENT DOCUMENTS

| | | | |
|---|---|---|---|
| 4,555,702 | 11/1985 | Matsuura et al. | 340/825.64 |
| 4,653,016 | 3/1987 | Mueller | 364/724 |
| 4,764,981 | 8/1988 | Miyahara et al. | 455/603 |
| 5,005,187 | 4/1991 | Thompson | 375/94 |
| 5,043,829 | 8/1991 | Hahn | 360/15 |
| 5,055,746 | 10/1991 | Hu et al. | 315/291 |
| 5,068,576 | 11/1991 | Hu et al. | 315/291 |
| 5,107,184 | 4/1992 | Hu et al. | 315/291 |

FOREIGN PATENT DOCUMENTS

| | | |
|---|---|---|
| 0514078 | 11/1992 | European Pat. Off. . |
| 0525667 | 2/1993 | European Pat. Off. . |
| 58-162189 | 9/1983 | Japan . |
| 58-184897 | 10/1983 | Japan . |
| 61-67338 | 4/1986 | Japan . |
| 1-272398 | 10/1989 | Japan . |

OTHER PUBLICATIONS

Philips Lighting, IFS 800 Lighting Control System, Product Information Brochure, Oct. 1990.
Philips Lighting, Passir: infrared remote–control lighting via a busline, Nov. 1991.
Philips Lighting, IFS 1 Lighting control system, Product Information Brochure, Apr. 1990.
Philips Lighting, Passir IRT 4000/00: the new link between centralised and individual lighting control, Product Information Brochure, Apr. 1993.
Philips Lighting, IFS 100 Lighting control system, Product Information, Brochure, Jun. 1990.
Philips Lighting, IFS Lighting control system overview Brochure, Sep. 1990. Brochure, Apr. 1990.
Philips Lighting, MCS Mark II the remote, infrared lighting controls system for greater flexibility, extra user comfort and economy, Product Information Brochure, Apr. 1993.
Philips Electronics, Divisional Standardizatin Department, Description About The RC–5 Universal Infra–Red Remote–Control System, pp. 1–33, 19 Jun. 1985.
Signetics, Linear Products, Section 5 Remote Control System, pp. 5–3 to 5–54, Dec. 2, 1986.
Philips Lighting at the 1993 Hanover Fair (Hall 9, Stand No. C 32), Apr. 1993/4931.E, pp. 1–6.
The MN6011A is a Remote Control Transmitting CMOS LSI capable of mounting 64 keys on which custom codes can be freely set as well as 32 unified keys.

*Primary Examiner*—Leo Boudreau
*Assistant Examiner*—Kinfe-Michael Negash
*Attorney, Agent, or Firm*—Laurie E. Gathman

[57] ABSTRACT

A lighting system having an electric lamp controlled by an infrared remote controller. The remote controller incorporates a commercially available transmitter and receiver which reliably functions in the presence of infrared noise having frequencies at and about the carrier frequency of the transmitted signal. The remote controller receiver outputs a demodulated signal and a filter acts on the demodulated signal to remove noise present in the demodulated signal caused by the electric lamp by comparing measured time intervals between leading and trailing edges of the demodulated signal to predetermined values defining data elements.

36 Claims, 5 Drawing Sheets

LIGHTING SYSTEM HAVING A REMOTELY CONTROLLED ELECTRIC LAMP AND AN INFRARED REMOTE CONTROLLER WITH IMPROVED INFRARED FILTER

This is a continuation of application Ser. No. 08/146,294, filed Oct. 28, 1993 now abandoned.

BACKGROUND OF THE INVENTION

1. Field of the Invention

The present invention is directed generally to a lighting system having an electric lamp controlled by an infrared remote controller and, in particular, to an improved filter in an electric lamp remote control receiver which filters infrared noise generated by an electric lamp.

2. Description of the Prior Art

A typical remote control system includes a transmitter for transmitting information through modulation of an infrared ("IR") signal having a certain carrier frequency, and a receiver for receiving the signal and either creating an output signal or performing some function. The information in the modulated transmission signals typically includes leader code, logic 1's and logic 0's which are each defined, in one type of modulation, by the duration of time 21, 22 between bursts 20 of carrier pulses as shown in FIG. 3(a), or in other words, by the pulse period. An infrared receiver receives the modulated transmission signal through a photo diode, the signal is then sent through a pre-amplifier level control block, which acts as a gain control. A limiter clamps the amplitude of the modulated signal and the modulated signal is filtered by a bandpass filter which filters out noise having a frequency outside the bandwidth of the bandpass filter. The signal is also demodulated, amplified and then shaped into a square wave by a waveform shaping block. The pulse width 21a, 22a of the square wave as shown in FIG. 3(b) corresponds to the times 21, 22 between bursts of the transmitted signal and determine the type of data being transmitted. A decoder decodes the transmitted information from the square wave.

Infrared signals are affected by interference caused by various ambient sources such as the sun, incandescent and fluorescent lamps, infrared stereo headphone transmitters, etc. In the past, the interference associated with IR signals was attenuated by selecting a carrier frequency of the transmitted IR signal such that it was outside the range of ambient noise and by using various filters to filter out any signals having frequencies falling outside a band surrounding the chosen transmitting frequency. Such a design is known, for example, from the Signetics AN1731 Low-Power Remote Control IR Transmitter and Receiver Preamplifiers wherein the carrier frequency of the IR signal is 38 kHz and the receiver is a narrow band receiver which filters out TV line frequencies having harmonics falling outside a 3 kHz band surrounding the 38 kHz transmitted frequency. Because these types of band pass filters attenuate noise which falls outside the narrow frequency band of the filter a proper carrier frequency must be chosen which is outside the frequency range of ambient noise. If, however, there exists ambient noise at a frequency within the band of the bandpass filter, these types of filters will allow the ambient noise to interfere with the received transmission signal. The ambient noise which passes through the bandpass filter will be acted on by the various stages of the receiver and, depending on its intensity, duration, and frequency, will appear in the square wave output of the wave-shaper as extraneous leading and trailing edges within the duration of time required for a logic 0 or a logic 1 to be transmitted, as shown in FIG. 3c. These extraneous edges cause false decoding of the transmitted information from the square wave.

It has become increasingly more difficult to select a transmitting frequency outside the frequency range of all ambient noise. Infrared, i.e. noise generated by the sun and incandescent lamps have frequencies from 0 to 120 Hz, and noise generated by stereo headphone transmitters ranges from 95 kHz to 250 kHz with a frequency deviation of 50 kHz. Light transmitted from fluorescent lamps operated by high frequency dimming ballasts, which have only recently been made commercially available, has frequencies around 20–120 kHz. It has been found that the infrared component of the light from such high frequency operated fluorescent lamps will interfere with the transmitted 38 kHz signal frequency of the Signetics AN1731 remote controller, as the bandpass filter allows noise to pass having a frequency within the band of the bandpass filter. Thus, it is close to impossible to find a transmission frequency which is not the same frequency as some source of infrared noise, especially when operating in the vicinity of a fluorescent light controlled by a high frequency dimming ballast.

In U.S. Pat. No. 4,555,702, a remote control signal reproducing circuit is disclosed. This circuit will filter out the noise present in a modulated signal by counting the number of carrier pulses within a certain time interval and comparing the number counted to several predetermined values to determine whether a control signal is being received or whether noise is being received. Although U.S. Pat. No. 4,555,702 refers to these pulses as modulated signal pulses, they will be referred to as carrier pulses herein. Specifically, it considers the number of carrier pulses which would normally be present in a pulse width, i.e. if the carrier frequency is 40 kHz and the pulse width is 1 ms, then each burst in the transmission signal without noise would contain 40 carrier pulses within the 1 ms time period. If, however, noise is present, there may be only 30 carrier pulses since noise may cancel some of the pulses. It compares the number of pulses counted to several predetermined values, such as a minimum and maximum number of pulses for a valid pulse width, and decides whether a transmission signal is being received or whether noise is being received. It only assumes, however, that noise will subtract from the number of carrier pulses present rather than also adding to the number of pulses present, such as if the noise has a higher frequency than the carrier frequency.

The filter of U.S. Pat. No. 4,555,702 operates on the signal before the signal is demodulated. That is, the carrier pulses are present when the system removes noise. Most IR receivers, especially in the consumer electronics area, output a signal which is demodulated. Therefore, the filter disclosed in U.S. Pat. No. 4,555,702 cannot be used with these "off-the-shelf" receivers.

SUMMARY OF THE INVENTION

Accordingly, it is desirable to provide a remotely controlled lighting system which incorporates a commercially available transmitter and receiver and which reliably functions in the presence of infrared noise having frequencies at and near the carrier frequency, and, in particular, in the presence of a fluorescent lamp driven by a high frequency ballast.

According to the invention, a lighting system including a remote control system is provided, wherein the remote control system includes a receiver which is receptive of a transmission signal having a carrier frequency and receptive of infrared noise from an electric lamp having a frequency at and about the carrier frequency. The receiver demodulates the transmission signal and a filter acts on the demodulated signal to remove noise therein caused by the infrared light from the electric lamp. Since the filter acts on the demodulated signal, commercially available IR receivers may be used, which lowers system cost.

In another embodiment of the invention, the filter operates on a demodulated signal wherein noise appearing as leading and trailing edges in the demodulated signal is filtered from transmitted information in the transmission signal which comprises data elements also formed of leading and trailing edges. The filtering is performed by measuring the duration of time between detection of a leading edge and detection of a trailing edge and comparing the duration of time to a predetermined time range defining a data element. If the measured time range is outside the predetermined time range, the trailing edge will be rejected as noise and scanning will continue until another trailing edge is detected.

In a yet another embodiment of the invention, the demodulated transmission signal includes a first set of data elements and a second, inverted set of data elements in which each data element is the inverted logical equivalent of a respective data element in the first set of data elements and the filter inverts the second inverted set and compares it to the first set. If an inconsistency appears between the first set and the inverted second set, the data received is ignored.

In still another embodiment of the invention, the filter is incorporated in a microcontroller which further includes control capabilities for controlling a lamp driver circuit, such as a high frequency dimming ballast for fluorescent lamps.

Accordingly, it is an object of the instant invention to provide a lighting system including a remote control system wherein the remote control system includes a receiver having a filter which does not require, for the removal of noise, that the transmission frequency of a signal be substantially different than the noise frequency.

A further object of the present invention is to provide an infrared remote controller which ignores infrared signals caused by a fluorescent lamp operated at high frequencies.

Yet another object of the present invention is to provide a filter which improves the operating distance of an infrared remote control system operated in the vicinity of a fluorescent lamp operated at high frequencies.

Still another object of the instant invention is to provide a filter which operates on the demodulated signal of a remote control device and removes the noise having a frequency at and about the carrier frequency of a transmitted signal.

Still other objects and advantages of the invention will be apparent from the drawings, detailed description, and claims.

The invention accordingly comprises several steps and the relation of one or more of such steps with respect to each of the others, and the apparatus embodies features of construction, combination of elements and arrangement of parts which are adapted to effect such steps, all as exemplified in the following detailed disclosure. The scope of the invention will be indicated in the claims.

BRIEF DESCRIPTION OF THE DRAWINGS

For a fuller understanding of the invention, reference is had to the following description taken in connection with the accompanying drawings, in which:

FIG. 3(a) is a diagram of a normal infrared signal which does not contain noise;

FIG. 3(b) is a diagram of an infrared receiver output after receiving the input from FIG. 3a;

FIG. 3(c) is a diagram of an infrared receiver output after receiving an IR signal with noise;

DESCRIPTION OF THE PREFERRED EMBODIMENTS

Figure 1:
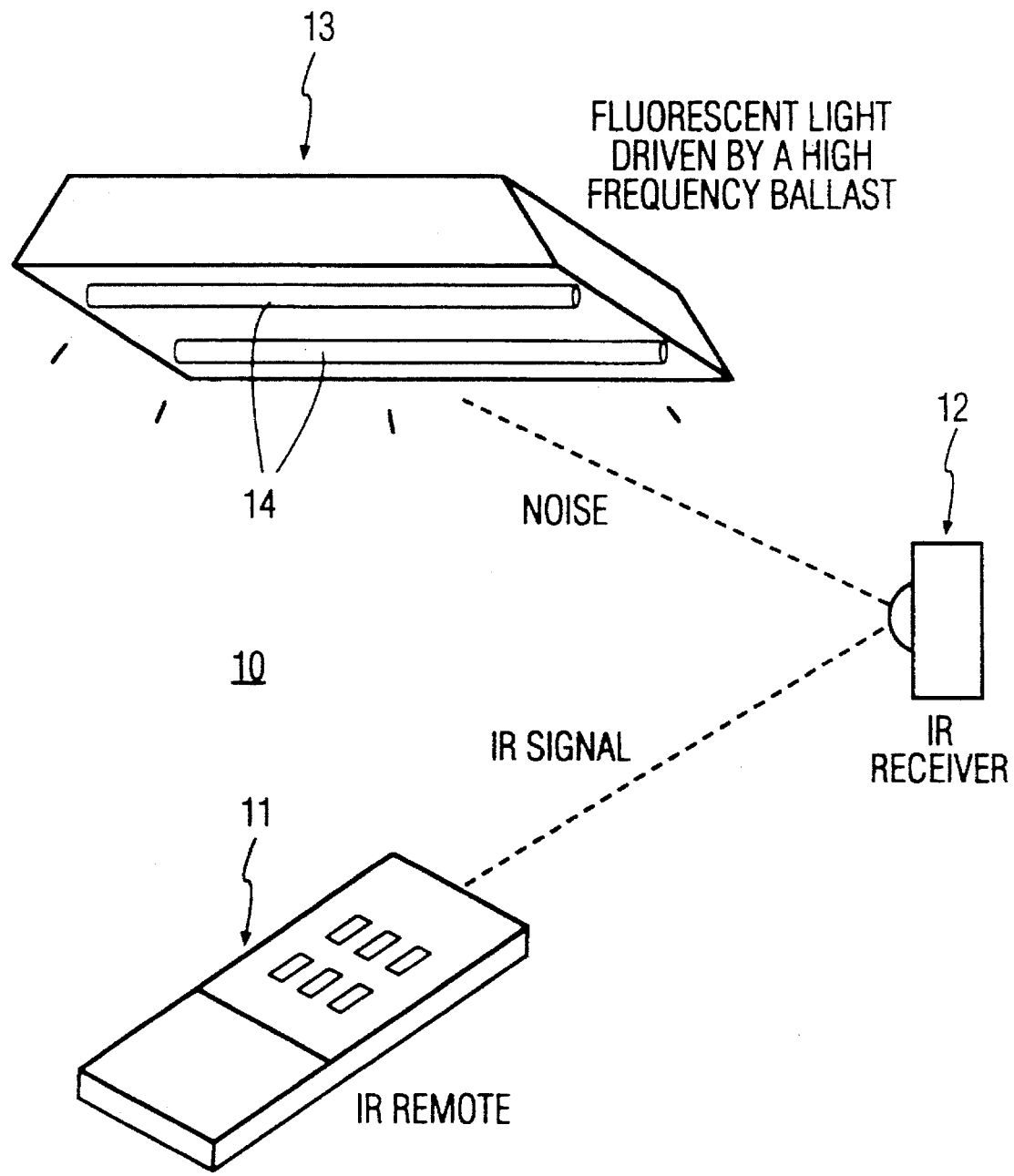
FIG. 1 illustrates a lighting system including a fluorescent lamp driven by a high frequency ballast and including an infrared remote controller.

Reference is first made to FIG. 1 which depicts a lighting system generally indicated at 10 including an infrared remote control transmitter 11, a receiver 12, and a fluorescent fixture 13 including lamps 14 driven at a high frequency by a high frequency electronic ballast (not shown). The transmitter 11 outputs a transmission signal having a carrier frequency and including transmitted information for controlling the lamps 14, such as turning them on and off and dimming.

Figure 2:
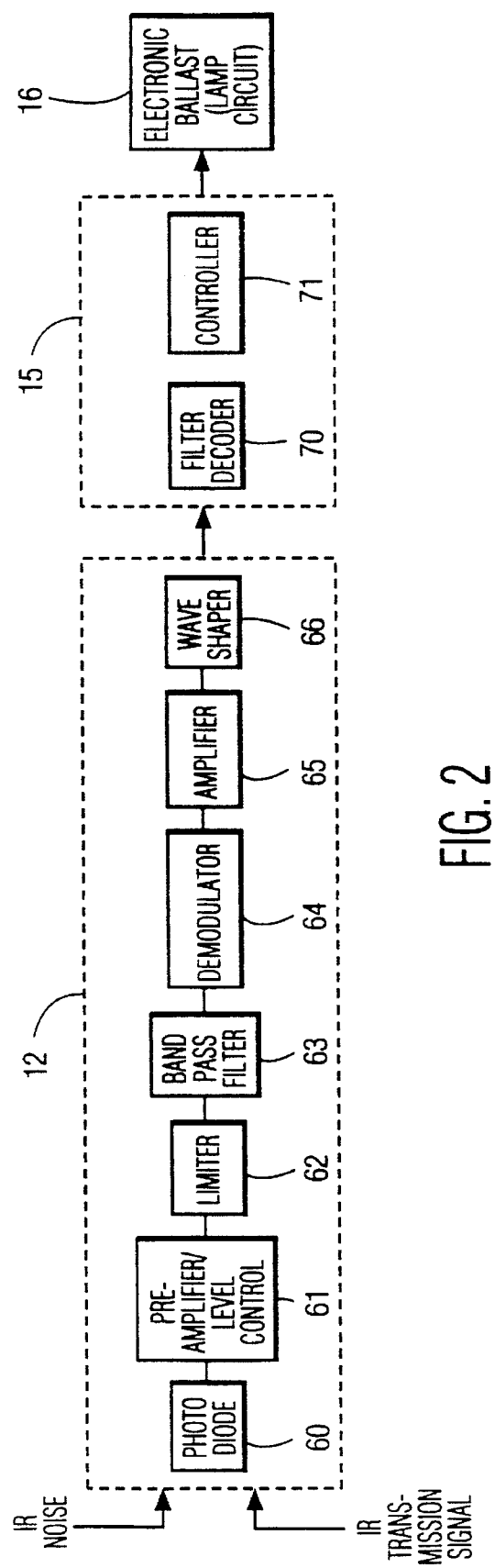
FIG. 2 is a block diagram further illustrating the components present in the lighting system of FIG. 1.

FIG. 2 is a block diagram illustrating the components of the system (without the transmitter) in greater detail. The conventional receiver 12 includes a receiving photo diode 60 which detects the transmission signal, a preamplifier/level control 61 which amplifies the received signal, a limiter 62 for clamping the amplitude, a bandpass filter 63 which is tuned to the carrier frequency and which allows only signals having frequencies at and around the carrier frequency of the transmission signal to be received, a demodulator 64, another amplifier 65, and a wave form shaping device 66 which turns the received signal into a square wave containing leading and trailing edges. Such a receiver is well known in the art. The output of the receiver 12 is an input of a microprocessor 15 which includes the filter decoder 70 of the present invention and a controller 71 for controlling a lamp drive circuit or electronic ballast 16 of the light fixture 13.

The infrared component of the light from fluorescent lamps 14 is detected by the photo diode 60 along with the IR transmission signal from the transmitter 11. If the frequency of the light from lamps 14 is at or about the carrier frequency of the transmission signal it causes noise in the form of extraneous leading and trailing edges in the square wave output of receiver 12 because it will not be filtered by the band pass filter 63. The greater the distance is between the transmitter and the receiver the greater is the noise component in the received signal as compared to the transmission signal. Thus, by removing noise the operating distance of the remote control increases.

FIG. 3(a) depicts a typical IR remote control signal from the transmitter 11 which includes pulse energy 20 in the form of carrier pulses at the carrier frequency. The period of the modulating wave represents the digital logic levels of the data being transmitted. For example, a logic 0 is indicated as the duration of time 21 between bursts of carrier pulses, and a logic 1 is indicated as a different duration of time 22 between bursts of carrier pulses. Leader code, which indicates the start of a series of data, is indicated as the duration of time 23. Upon receipt of the signal in FIG. 3(a), the IR receiver 12 demodulates and wave shapes the signal into the square wave of FIG. 3(b), wherein the duration of time between the bursts of carrier pulses is indicated as a high voltage level for that same duration of time 21a, 22a. If however, high frequency noise from lamps 14 occurs during transmission of the signal, then the demodulated signal, which is the output of a typical IR receiver, may also include noise as depicted in FIG. 3(c).

The duration of time Y in FIG. 3(c) represents the predetermined duration of time selected for a logic 0 to be transmitted by the IR transmitter. Similarly, the duration of time X in FIG. 3(c) is the predetermined duration of time selected to transmit a logic 1. Y1 indicates the duration of time between the first leading edge 24 of a logic 0 pulse and the subsequent trailing edge 25 caused by noise. Y2 indicates the duration of time between the leading edge 26 caused by noise and the subsequent trailing edge 27 of the logic 0 pulse. When Y1 and Y2 are added together, they approximately equal the duration of time Y required to transmit a logic 0 pulse. Similarly, the times X1 +X2 +X3 approximately equal the duration of time required to transmit a logic 1.

The present invention will measure the duration of time between a leading edge 28, which in part defines the interval of time X1, and a trailing edge 29, which in part defines the interval of time X3, or between a leading edge 24, which in part defines the interval of time Y1, and a trailing edge 27, which in part defines the interval of time of Y2, and if this measurement falls within a predetermined range of values indicated as X'-X" for a logic 1 or Y'-Y" for a logic 0 then the present invention will ignore the interference and recognize the detection of a logic 1 or a logic 0 depending on the measurement calculated. Similarly, the same is performed for leader code wherein the predetermined range of values is indicated as Z'-Z". For example, if a logic 0 is represented in the square wave signal by a time interval Y of 600 μs between a leading edge and a subsequent trailing edge, then the predetermined range for a logic 0 Y'-Y" may be set for example at 400 μs to 800 μs If the duration of time between the detection of a leading edge and subsequent trailing edge is within this range then a logic 0 will be recorded. If, however, the duration of time is less than 400 μs the trailing edge will be ignored until another trailing edge is detected. The duration of time between the leading edge and this second trailing edge is measured and if it falls within 400 μs to 800 μs then a logic 0 is recorded. If it is greater than 800 μs, however, it is then compared to a predetermined range X'-X" for a logic 1 to be transmitted, e.g. 1000 μs to 1400 μs. If the measured time is less than 1000 μs, then a subsequent trailing edge is searched for until the measured time falls within the predetermined range 1000 μs to 1400 μs or becomes greater than 1400 μs. If the subsequent trailing edge yields a duration over 1400 μs, then it is assumed to be leader code and compared to an appropriate time range for leader code, i.e Z'-Z".

Figure 4:
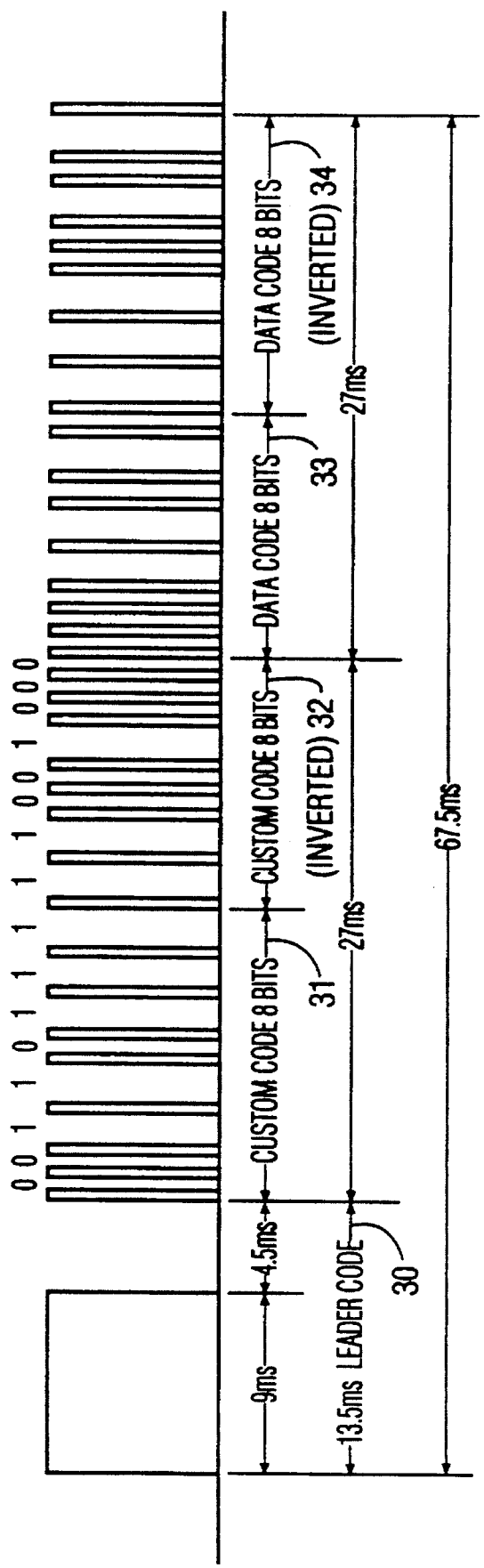
FIG. 4 is a diagram of the output waveforms from an infrared transmitter.

Reference is next made to FIG. 4 wherein various data elements of a typical transmitted IR signal without a noise component are shown. FIG. 4 represents the IR signal which includes leader code 30, custom code 31, inverted custom code 32, data code 33, and inverted data code 34. The leader code 30 signifies the beginning of the transmission of data. The custom code 31 is customized code which differs for different manufacturers of consumer electronics. The inverted custom code 32 is the logical opposite of the custom code 31, so, for example, if the custom code 31 is 00110111 then the inverted custom code 32 is 11001000. The data code 33 is the actual commands being transmitted to the receiver 12. The inverted data code 34 is the logical opposite of the data code 33.

Figure 5:
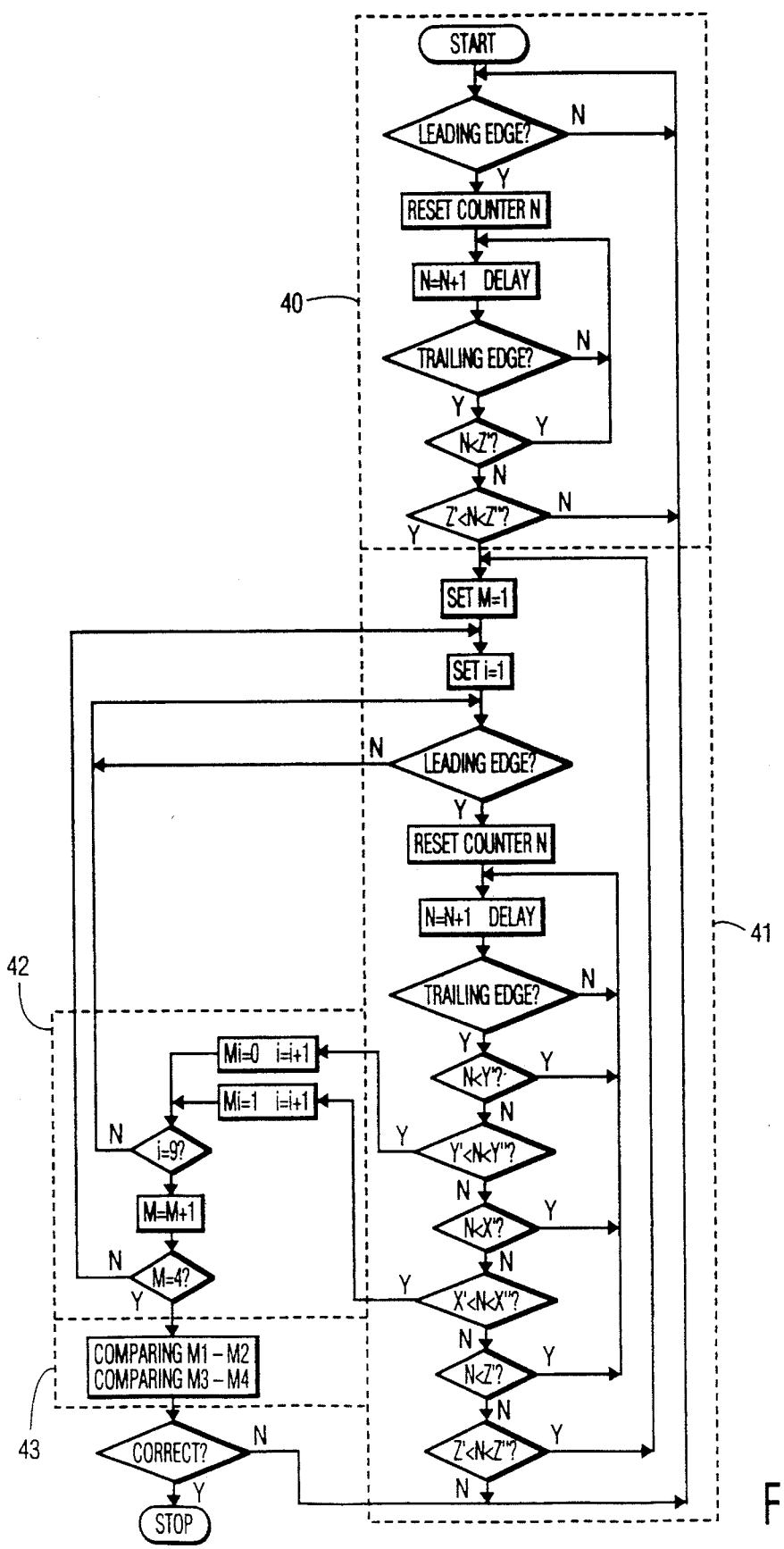
FIG. 5 is a flow chart of the method of filtering a demodulated IR signal containing noise.

Reference is now made to FIG. 5 which is a flow chart of the steps taken by the filter 70 to remove the noise from the demodulated square wave signal according to the present invention. As seen from this flow chart, "counter N" keeps track of the duration of time between a leading edge and a trailing edge of the square wave represented in FIG. 3(c). The first portion 40 of the flow chart searches for the leader code 23. It begins the counting process once a leading edge is detected. It then searches for a subsequent trailing edge. Once a subsequent trailing edge is detected, the value of N is compared to an approximate range of time, Z'-Z" for leader code. If the value of N is within this range Z'-Z", then a search for data begins by searching for another leading edge. If N is not within Z'-Z" then it continues to search for a subsequent trailing edge having a time duration from the first detected edge within the Z'-Z" time range. Once the elapsed time is greater than the high end of Z" of this time range, a new leading edge is detected and process repeats.

Once leader code is found, block 41 of the flow chart searches for digital custom code 33 in the demodulated signal. Another leading edge is detected and the counter is again reset and a search for a subsequent trailing edge begins. Upon detection of the trailing edge, the value of N is compared to an approximate range of time Y'-Y". If N is less than this range, it continues to look for another trailing edge and N continues to increment, if a trailing edge is found and N falls within the range Y'-Y" then block 42 stores a logic 0 as the first bit of data, the counter is then reset and a new search for a leading edge begins. If, however, N is greater than the upper end Y" of the range Y'-Y" then the value N is compared to X' the low end of the range X'-X", if N is less than X', then N continues to count until another trailing edge is found. If N is within the range X'-X", then a logic 1 is stored by block 42. If, however, N is greater than the upper end X" of range X'-X" then N is compared to the range Z'-Z" as it may be detecting leader code. If it is leader code, then the steps 41 begin again, otherwise the steps 40 begin again. Once all eight bits of each of the custom and data codes, and their inverted counterparts, are read and stored by block 42 (depending on the transmitter, the number of bits and types of code may be different), block 43 performs a comparison between the code and the inverse of its inverted code. This comparison checks for any inconsistencies between the two sets of transmitted code. If inconsistencies exist, then the process is started all over again and the data read is ignored.

By performing these steps on a demodulated signal, noise which has a frequency at and about the transmitting frequency can be filtered out, thereby increasing the operating distance of a remote control device. Thus, the filter/decoder discussed above has application outside of a remote controller for a lighting system and would be useful in any infrared remote controller, for example, consumer electronics, which might be subject to interfering infrared light from a high frequency operated electric lamp or other source having a frequency at or near the carrier frequency.

In an example of the lighting system according to the invention, the steps shown in FIG. 5 for the filter/decoder 70 in accordance with the invention were incorporated in software in a Motorola 68HC05 microcontroller. The receiver 12 in FIG. 2 was a Citizen Electronics Model RS-20 Remote Control Sensor having its output connected to the 68HC05 microcontroller. The system was tested using both an EBT Dimming Ballast LCG-120-2/32 L/H and an LCG 277-2/32 L/H, both available from Electronic Ballast Technology, Inc. of Torrance, Calif. found that the remote control operating distance increased by about 50% with the filter shown in FIG. 5.

Figure 3:
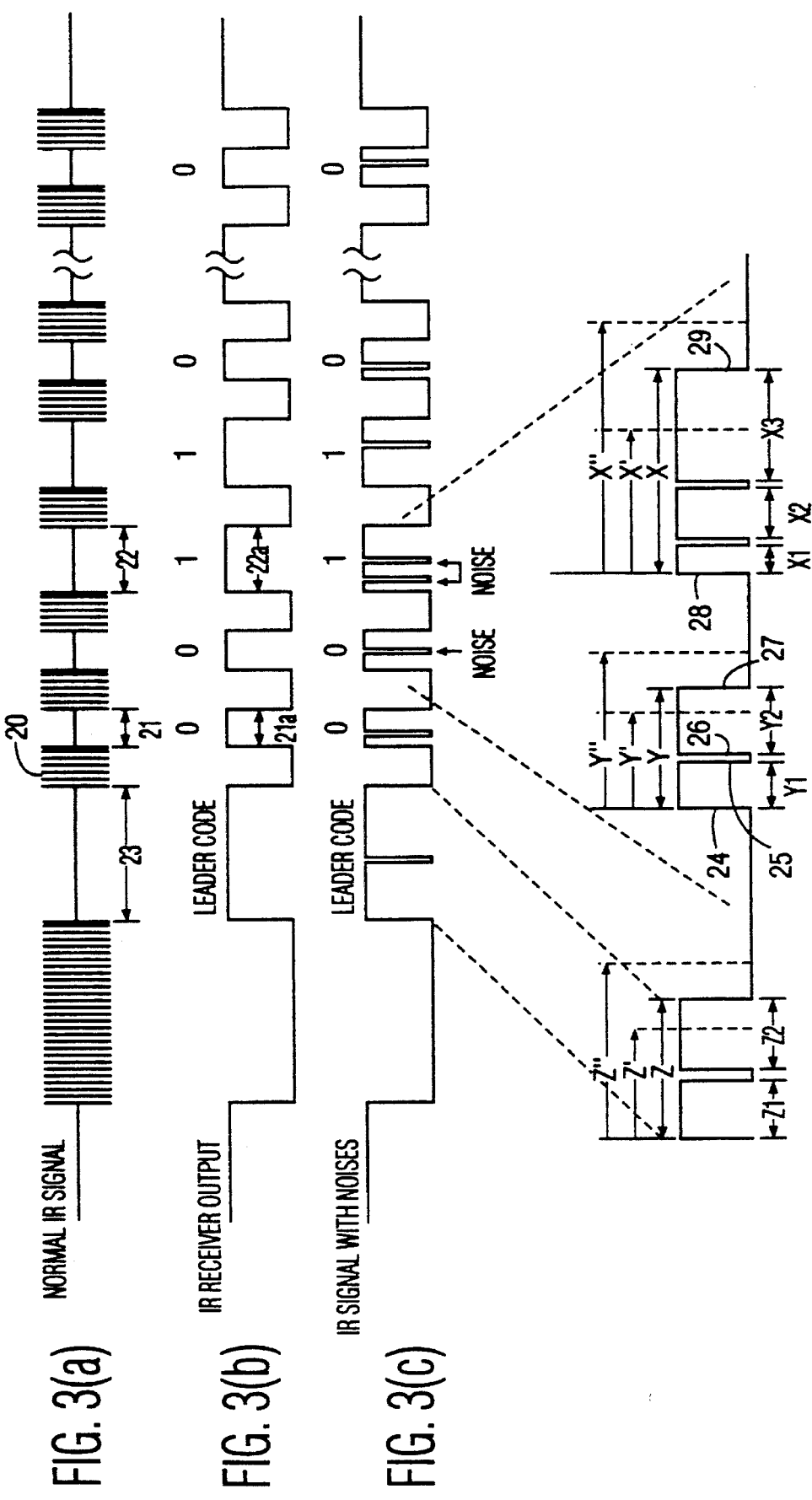

The controller 71 for controlling the electronic ballast 16 was also incorporated in the 68HC05 microcontroller and received the decoded digital data from the filter/decoder 70 to turn on, turn off and dim the lamps 14 in response to commands from the transmitter 11. Since the exact implementation of the controller is not necessary for the understanding of the filter/decoder according to the invention and will vary depending on the type of ballast selected for the lighting system, it will not be discussed in detail here. However, there are numerous controllers known in the art for controlling electronic ballasts. By way of example, a remote control device for a fluorescent lamp ballast is described in U.S. Pat. No. 5,055,746 (Hu et al) which is incorporated herein by reference. FIG. 3 of this patent shows a controller 14 for controlling an electronic ballast which includes an infrared receiver 56 coupled to microprocessor 36, which is programmed to carry out the functions described in cols. 4, 5. Those of ordinary skill in the art would readily be able to program the controllers of the '746 patent to incorporate the filter/decoder of FIG. 5 or conversely to program the control functions disclosed in the '746 patent in the Motorola controller disclosed above.

It will thus be seen that the objects set forth above, among those made apparent from the preceding description, are efficiently attained and, since certain changes may be made in carrying out the above method and in the construction set forth without departing from the spirit and scope of the invention, it is intended that all matter contained in the above description shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. In a lighting system of the type having an electric lamp and a remote controller for controlling the electric lamp, the remote controller including a transmitter which transmits information via modulated infrared light and a receiver which receives the infrared light, the receiver including means for demodulating the information therefrom, decoding means for decoding the demodulated information coupled to the receiver and including filter means, the filter means for operating on the demodulated information for removing noise caused by infrared light from the electric lamp, the demodulated information including a plurality of leading and trailing edges, the transmitted information having a data element defined in the demodulated information by a leading edge followed by a trailing edge within a predetermined time range, and the noise is present in the demodulated information as a leading edge followed by a trailing edge at random time intervals, and said filter means filters noise from the demodulated information by determining which leading and trailing edges correspond to noise and which leading and trailing edges correspond to the date element, and wherein the filter means is software within a microcontroller which controls operation of the electric lamp.

2. The lighting system according to claim 1, wherein said filter means comprises:

detecting means for detecting the leading and trailing edges in the demodulated information;

measuring means coupled to the detecting means for measuring the time interval between a detected leading edge and subsequently detected trailing edges;

comparing means coupled to the measuring means for comparing the measured time intervals to the predetermined time range; and means for accepting the detection of a trailing edge as a decoded data element if a measured time interval is within the predetermined time range defining the data element and for rejecting the detection of a trailing edge as noise if the measured time interval falls outside of the predetermined time range, said means for accepting and rejecting being coupled to the comparing means.

3. The lighting system according to claim 2, wherein the transmitted information includes a plurality of data elements each defined by distinct predetermined time ranges between a leading edge and a subsequent trailing edge, and said comparing means compares the measured time intervals with each of the distinct time ranges.

4. The lighting system according to claim 3, wherein the transmitted information includes a first set of data elements and a second, inverted set of data elements in which each data element is the inverted logical equivalent of a respective data element in the first set of data elements, and said filter means further comprises:

means for inverting the decoded data elements of the second, inverted set of data elements, said means for inverting being coupled to the means for accepting and rejecting; and means for detecting inconsistencies between each decoded data element of the first set of data elements and the respective data element of the second set of data elements, said means for detecting inconsistencies being coupled to the means for inverting.

5. The lighting system according to claim 4, further comprising means for shaping the demodulated information into a square wave signal and wherein said filter means acts on the square wave signal, and wherein the means for shaping is coupled to the means for demodulating.

6. The lighting system according to claim 5, further comprising lamp drive means for driving said electric lamp in a frequency range of between about 20 khz and about 120 khz, said lamp drive means being connected to said receiver and responsive to the demodulated, filtered information and wherein said transmitter transmits infrared light with a carrier frequency within this range.

7. The lighting system according to claim 6, wherein said electric lamp is a fluorescent lamp.

8. The lighting system according to claim 1, further comprising lamp drive means for driving said electric lamp in a frequency range of between about 20 khz and about 120 khz, said lamp drive means being connected to said receiver and responsive to the demodulated, filtered information and wherein said transmitter transmits infrared light with a carrier frequency within this range.

9. The lighting system according to claim 1, wherein said electric lamp is a fluorescent lamp.

10. The lighting system according to claim 1, wherein the filter means is software within the microcontroller.

11. In a remote control system of the type including a transmitter which transmits information via a modulated infrared light and a receiver which receives the infrared light from said transmitter, the receiver including means for demodulating the transmitted information therefrom, the improvement comprising:

decoding means coupled to the receiver and including filter means for operating on the demodulated information for removing noise caused by an electric lamp emitting infrared light, the demodulated information including a plurality of leading and trailing edges, the transmitted information having a data element defined in the demodulated information by a leading edge followed by a trailing edge within a predetermined time range, and the noise is present in the demodualted information as a leading edge followed by a trailing edge at random time intervals, and said filter means filters noise from the demodulated information by determining which leading and trailing edges correspond to noise and which leading and trailing edges correspond to the date element, and wherein the filter means is software in a microcontroller which controls operation of an appliance.

12. The remote control system according to claim 11, wherein said filter means comprises:

detecting means for detecting the leading and trailing edges in the demodulated information;

measuring means coupled to the detecting means for measuring the time interval between a detected leading edge and subsequently detected trailing edges;

comparing means coupled to the measuring means for comparing the measured time intervals to the predetermined time range; and means for accepting the detection of a trailing edge as a decoded data element if a measured time interval is within the predetermined time range defining the data element and for rejecting the detection of a trailing edge as noise if the measured time interval falls outside of the predetermined time range, said means for accepting and rejecting being coupled to the comparing means.

13. The remote control system according to claim 12, wherein the transmitted information includes a plurality of data elements each defined by distinct predetermined time ranges between a leading edge and a subsequent trailing edge, and said comparing means compares the measured time intervals with each of the distinct time ranges.

14. The remote control system according to claim 13, wherein the transmitted information transmitted by the transmitter includes a first set of data elements and a second, inverted set of data elements in which each data element is the inverted logical equivalent of a respective data element in the first set of data elements, and said filter means further comprises:

means for inverting the decoded data elements of the second, inverted set of data elements, said means for inverting being coupled to the means for accepting and rejecting; and means for detecting inconsistencies between each decoded data element of the first set of data elements and the respective data element of the second set of data elements said means for detecting inconsistencies being coupled to the means for inverting.

15. The remote control system according to claim 14, further comprising means for shaping the demodulated information into a square wave signal and wherein said filter means acts on the square wave signal, and wherein the means for shaping is coupled to the means for demodulating.

16. The remote control system according to claim 15, wherein said transmitter transmits infrared light having a carrier frequency of between about 20 khz and about 120 khz and said filter means is effective for filtering noise from the demodulated information caused by infrared light from an electric lamp operated, between about 20 khz and about 120 khz.

17. The remote control system according to claim 16, wherein said filter is effective for filtering noise caused by a fluorescent lamp operated within said frequency range of about 20 khz and about 120 khz.

18. The remote control system according to claim 11, wherein said transmitter transmits infrared light having a carrier frequency of between about 20 kHz and about 120 kHz and said filter means is effective for filtering noise from the demodulated information caused by infrared light from an electric lamp operated between about 20 khz and about 120 khz.

19. The remote control system according to claim 11, wherein said filter means is effective for filtering noise in the demodulated signal caused by the infrared light from a fluorescent lamp.

20. A receiver for an infrared remote controller operated in the presence of an electric lamp which emits infrared light, said receiver comprising:

means for receiving an infrared transmission signal which includes information encoded by modulation of the transmission signal, said receiving means also being responsive to the infrared light from the electric lamp;

demodulating means for demodulating the infrared signals received by said receiving means;

filtering means for filtering noise in the demodulated signals caused by the infrared light from the electric lamp; and decoding means for decoding the transmitted information from the demodulated signals, the demodulated information including a plurality of leading and trailing edges, the transmitted information having a data element defined in the demodulated information by a leading edge followed by a trailing edge within a predetermined time range, and the noise is present in the demodulated information as a leading edge followed by a trailing edge at random time intervals, and said filter means filters noise from the demodulated information by determining which leading and trailing edges correspond to noise and which leading and trailing edges correspond to the data element, and wherein the filtering means is software in a microcontroller which controls the electric lamp.

21. The receiver according to claim 20, wherein the filter means comprises:

detecting means for detecting the leading and trailing edges in the demodulated information;

measuring means coupled to the detecting means for measuring the time interval between a detected leading edge and subsequently detected trailing edges;

comparing means coupled to the measuring means for comparing the measured time intervals to the predetermined time range; and means for accepting the detection of a trailing edge as a decoded data element if a measured time interval is within the predetermined time range defining the data element and for rejecting the detection of a trailing edge as noise if the measured time interval falls outside of the predetermined time range, said means for accepting and rejecting being coupled to the comparing means.

22. The receiver according to claim 21, wherein the transmitted information includes a plurality of data elements each defined by distinct predetermined time ranges between a leading edge and a subsequent trailing edge, and said comparing means compares the measured time intervals with each of the distinct time ranges.

23. The receiver according to claim 22, wherein the transmitted information includes a first set of data elements and a second, inverted set of data elements in which each data element is the inverted logical equivalent of a respective data element in the first set of data elements, and said filter means further comprises:

means for inverting the decoded data elements of the second, inverted set of data elements, said means for inverting coupled to the means for accepting and rejecting; and means for detecting inconsistencies between each decoded data element of the first set of data elements and the respective data element of the second set of data elements said means for detecting inconsistencies being coupled to the means for inverting.

24. The receiver according to claim 23, further comprising means for shaping the demodulated signals into a square wave signal, and wherein said filter means acts on the square wave signal, and wherein the means for shaping is coupled to the means for demodulating.

25. The receiver according to claim 24, wherein the transmission signal has a carrier frequency in a range of between about 20 khz and about 120 khz and said filter means is effective for filtering noise in the demodulated signal caused by infrared light from an electric lamp operated at a frequency between about 20 khz and about 120 khz.

26. The receiver according to claim 25, wherein said filter means is effective for filtering noise from a fluorescent lamp operated at a frequency wherein about 20 khz and about 120 khz.

27. The receiver according to claim 20, wherein the electric lamp is operated in a frequency range of between about 20 khz and about 120 khz and said infrared light transmitted by the transmitter has a carrier frequency between about 20 khz and about 120 khz.

28. The receiver according to claim 20, wherein said filter means is effective for filtering noise in the demodulated signal caused by the infrared light from a fluorescent lamp.

29. A method of transmitting and receiving information with an infrared transmission signal in the presence of an electric lamp operated at high frequency, said method comprising the steps of:

transmitting an infrared transmission signal having a carrier frequency within the frequency range of the electric lamp and modulating the transmission signal to transmit information;

receiving the infrared transmission signal and infrared light from the electric lamp;

demodulating the received signal and producing a demodulated signal including a plurality of leading and trailing edges, the transmitted information has a data element defined in the demodulated signal by a leading edge followed by a trailing edge within a predetermined time range, and the noise is present in the demodulated signal as a leading edge followed by a trailing edge at time intervals outside of the predetermined time range; and decoding and filtering noise from the demodulated signal caused by high frequency infrared light from the electric lamp the filtering step including the step of determining which leading and trailing edges correspond to noise and which leading and trailing edges correspond to the data element, and wherein the step of decoding and filtering is performed by software within a microcontroller which controls operation of an appliance.

30. The method according to claim 29, wherein the determining step includes the steps of:

detecting the leading and trailing edges in the demodulated signal;

measuring the time interval between a detected leading edge and subsequently detected trailing edges;

comparing the measured time intervals to the predetermined time range; and accepting the detection of a trailing edge as a decoded data element if a measured time interval is within the predetermined time range defining the data element and rejecting the detection of a trailing edge as noise if the measured time interval falls outside of the predetermined time range.

31. The method of claim 30, wherein the transmitted information includes a plurality of data elements each defined by distinct predetermined time ranges between a leading edge and a subsequent trailing edge; and the comparing step compares the measured time intervals to each of the distinct time ranges.

32. The method of claim 31, wherein the transmitted information includes a first set of data elements and a second, inverted set of data elements in which each data element is the inverted logical equivalent of a respective data element in the first set of data elements, and the filtering step further includes the steps of:

inverting the decoded data elements of the second, inverted set of data elements; and detecting inconsistencies between each decoded data element of the first set of data elements and the respective data element of the second set of data elements.

33. The method according to claim 31, wherein the step of filtering is performed by first detecting a leading edge and then detecting subsequent trailing edges until either one of (i) the measured time interval is within the predetermined time range of one of the data elements and (ii) the measured time interval exceeds the largest of the predetermined time ranges, at which point the filter means detects the next leading edge occurring after the last detected trailing edge.

34. A microcontroller for controlling an electric lamp including a filter in the form of software in the microcontroller and a decoding device for filtering a signal which includes a plurality of leading and trailing edges, the signal including a data element defined by a leading edge followed by a trailing edge within a predetermined time range and noise present in the signal as a leading edge followed by a trailing edge at random time intervals, wherein the filter comprises:

detecting means for detecting the leading and trailing edges in the signal;

measuring means coupled to the detecting means for measuring the time interval between a detected leading edge and subsequently detected trailing edges;

comparing means coupled to the measuring means for comparing the measured time intervals to said predetermined time range; and means for accepting the detection of a trailing edge as the data element if a measured time interval is within the predetermined time range defining the data element and for rejecting the detection of a trailing edge as noise if the measured time interval falls outside of the predetermined time range, said means for accepting and rejecting being coupled to the comparing means.

35. The filter according to claim 34, wherein the signal includes a plurality of data elements each defined by distinct predetermined time ranges between a leading edge and a subsequent trailing edge, and said comparing means compares the measured time intervals with each of the distinct time ranges.

36. The filter according to claim 35, wherein the signal includes a first set of data elements and a second, inverted set of data elements in which each data element is the inverted logical equivalent of a respective data element in the first set of data elements, and said filter means further comprises:

means for inverting the data elements of the second, inverted set of data elements, said means for inverting being coupled to the means for accepting and rejecting; and means for detecting inconsistencies between each data element of the first set of data elements and the respective data element of the second set of data elements, said means for detecting inconsistencies being coupled to the means for inverting.

* * * * *